United States Patent

[11] 3,577,166

[72] Inventor Abraham K. Yung
East Brunswick, N.J.
[21] Appl. No. 760,218
[22] Filed Sept. 17, 1968
[45] Patented May 4, 1971
[73] Assignee RCA Corporation

[54] C-MOS DYNAMIC BINARY COUNTER
14 Claims, 3 Drawing Figs.

[52] U.S. Cl. .......... 307/279, 307/205, 307/238, 307/251, 307/288
[51] Int. Cl. .......... H03k 3/26
[50] Field of Search .......... 307/205, 238, 251, 255, 279, 288, 304, 313

[56] References Cited

UNITED STATES PATENTS 3,322,974 5/1967 Ahrons et al. .......... 307/279
3,457,435 7/1969 Burns et al. .......... 307/205X
3,482,174 12/1969 James .......... 307/251X
3,483,400 12/1969 Washizuka et al. .......... 307/238X
3,493,786 2/1970 Ahrons et al. .......... 307/279

*Primary Examiner*—Stanley T. Krawczewicz
*Attorney*—H. Christoffersen

ABSTRACT: A dynamic flip-flop comprising two inverter means and two switching means is described. The switching means couple, by different conduction paths, the input node of one inverter means to the input node and to the output means of the other inverter. The switching means are alternately enabled by a clocking signal varying at a first rate causing the signals at the inputs and outputs of both inverter means to vary at one half said first rate.

The temporary or momentary storage provided by the capacitance at the input node of an inverter stage, coupled with the single pole, double throw action of the switching means, enables the design of a dynamic binary counter using a minimum number of components.

INVENTOR
ABRAHAM K. YUNG
BY H. Christoffersen
ATTORNEY

C-MOS DYNAMIC BINARY COUNTER

BACKGROUND OF THE INVENTION

The present invention relates to an improved dynamic binary counter circuit having a minimum number of components and which, in addition, exhibits low power dissipation, high speed, and reliable operation at low power supply voltages.

Many prior art circuits use inverters and transmission gates in the design of dynamic and static flip-flops. Those circuits, however, use more components than the present invention and, therefore, use more silicon chip area per function. Since a major aim in the design of circuits generally, and integrated circuits specifically, is the efficient utilization of the silicon chip area, optimal usage of the available silicon chip area requires the design of circuits using fewer components per function. An additional problem relative to the design of high density circuitry is the maximum power dissipation allowable. The use of complementary transistors to implement the invention—though the invention is not limited to their use—results in negligible steady state power dissipation and, therefore, in the minimization of the power consumption. However, even where the complementary inverter stage is used as the basic building block for the circuit, the power dissipation per stage is a direct function of the switching frequency ($P_{DISS}=CV^2f$). This is due to the fact that every time the inverter is clocked or switched, a considerable amount of current flows during the transition time between one of the two states. Thus, for example, where a function requires three instead of two inverter stages, the power consumption is increased by 50 percent. Many prior art circuits also use multiple clocks which have to be phased.

It is an object of the present invention to provide a dynamic flip-flop using a minimum number of components and very little power. The small number of components and the minimal power consumed per function enable the construction of high density circuits. Additionally, the simplicity of the circuit results in high yields and a great degree of reliability.

BRIEF SUMMARY OF THE INVENTION

In arrangements embodying the invention, a dynamic binary counter stage is obtained by means of two inverter means and two switching means.

Each inverter means has an input node and an output means. The input node of one inverter is coupled by a first switching means to the input node of the other inverter and by the second switching means to the output means of the other inverter.

BRIEF DESCRIPTION OF THE DRAWING

In the accompanying drawings, like reference characters denote like components.

DETAILED DESCRIPTION

Figure 1:
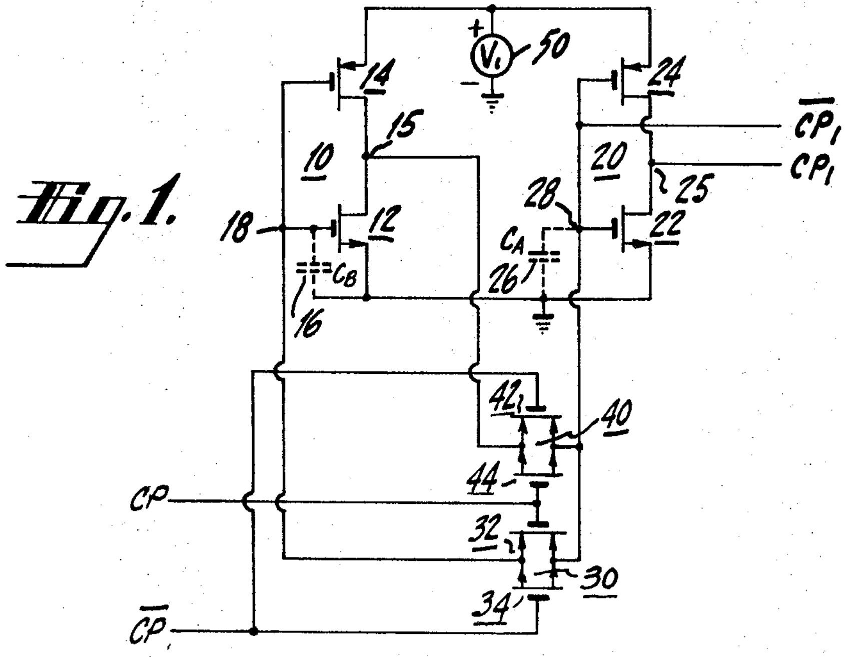
FIG. 1 is a schematic diagram of a dynamic binary circuit embodying the invention.

The active devices which are preferred for use in practicing the invention are those of a class known in the art as insulated-gate field-effect transistors (IGFET's). For this reason, the circuits are illustrated in the drawings as employing such transistors, and will be so described hereafter. However, this is not intended to preclude the use of other suitable devices and, to this end, the term "transistor," when used without limitation in the appended claims, is used in a generic sense.

An IGFET may be defined generally as a majority carrier device that comprises a body of semiconductive material having a source and a drain in contact with the body and defining generally the end of a conduction channel or current carrying path, through the body. A gate (control electrode) overlies at least a portion of the conduction path and is separated therefrom by an insulator or region of insulating material. Since the gate is insulated from the body, it does not draw any current under steady state operating conditions, or at least it draws no appreciable current, whereby the gate of one transistor may be connected directly to either the source or drain of the other transistor with little or no steady state current flow through the connection.

Associated with each gate of an IGFET is an input capacitance which is a function of the geometry of the transistor channel and the channel oxide thickness. Typically, the capacitance may be in the order of 0.2 to 1 picofarad. Though the gate capacitance is small, the fact the gate is insulated from the body renders the effective gate-to-source or gate-to-drain impedance extremely high—of the order of $10^{12}$ ohms or more. This permits the storing of charge on the gate capacitance since charge placed thereon will leak off very slowly. Calculating the time constant (RC), assuming a gate capacitance of one picofarad and an insulation resistance of $10^{12}$ ohms, reveals that it will take 1 second for the gate voltage to decay to 37 percent of its initial value ($1pf\times10^{12}$ ohms $=$ 1 second).

The gate capacitance may thus be used as a temporary storage or memory element since any charge placed thereon decays very slowly.

An IGFET may be either a P-type conductivity unit or an N-type conductivity unit. A P-type unit is one in which the majority carriers are holes, and an N-type unit is one in which the majority carriers are electrons. Enhancement type units are preferred in practicing the invention to depletion type units. By way of definition, a P-type enhancement unit has a relatively high conductivity conduction path when the gate voltage is negative relative to the source voltage, and has a very, very low conductivity when the gate and source voltages are equal, or the gate voltage is positive relative to the source voltage. Such a device is indicated in the drawings by the symbol appearing in FIG. 1 in which the source electrode is identified by an arrowhead pointing inwardly, and the drain may be identified as the other electrode on the same side of the device. As is known, insulated-gate field-effect transistors are bidirectional devices in which current can flow in either direction through the conduction channel. When a P-type device is employed as a bidirectional device, the drain and source electrodes may be interchanged, thus both the source and drain electrodes are shown having arrowheads pointing toward the body.

An N-type enhancement unit, on the other hand, is one which has a relatively high conductivity channel when its gate voltage is positive relative to its source voltage, and which has a very, very low conductivity when the source and gate voltages are equal, or when the gate voltage is negative relative to the source voltage. Such a device is represented in the drawings to be described by the symbol given in FIG. 1 where the source is that electrode to which an arrowhead is affixed. In this case, however, the arrow points away from the body. When an N-type device is employed as a bidirectional device, both the source and drain electrodes are shown having arrowheads pointing away from the body.

Transmission gate means—the switching means used to illustrate the invention—employ the directional property of an N-type and a P-type transistor. Using two transistors per transmission gate means ensures that one of the two transistors will be saturated when the transmission gate is enabled. When enabled, the gate presents a very low impedance, resulting in little voltage drop across its conduction path. The two-transistor gate prevents source follower mode operation wherein the gate and the source are offset by the threshold voltage ($V_T$) of a transistor.

Referring to FIG. 1, an example of a dynamic binary counter embodying the invention, it is seen that the circuit includes two inverter stages, 10 and 20, and two transmission gates, 30 and 40. Each of the inventers has a substantially similar configuration comprising a P-type IGFET and an N-type IGFET having their conduction paths connected in series between a point of reference potential, illustrated as circuit ground, and the positive terminal of a source 50 of $V_1$ volts operating potential, which may be, for example, a battery. Inverter 10 includes an N-type transistor 12, which has its source connected to ground and its drain connected in common with the drain of a P-type transistor 14 to output point 15. The gate of transistors 12 and 14 are connected in common and to one end of dashed capacitance 16 ($C_B$) at input node 18. $C_B$ represents the total capacitance at input node 18 which includes the gate capacitance of transistors 12 and 14 and the drain and source capacitances of transmission gate 30. It is marked in dashed lines to indicate that it is a distributed capacitance rather than a lumped element. The other end of $C_B$ is shown connected to ground (which is tied to the substrate).

Inverter 20 includes N-type transistor 22 with its source connected to ground and its drain connected in common with the drain of P-type transitor 24 at output point 25. The source of transistor 24 is, in turn, connected in common with the source of transistor 14 to the positive terminal of source 50. The gates of transistors 22 and 24 are connected in common and to one end of dashed capacitance 26 ($C_A$) at input node 28. The other end of $C_A$ is connected to ground. $C_A$ represents the total capacitance present at input node 28. This includes the gate capacitance of transistors 22 and 24, the drain and source capacitances of transmission gates 40 and 30, and any load capacitances associated with the output line marked $\overline{CP}_1$. Input node 28 of inverter 20 is coupled to the input node 18 of inverter 10 by means of transmission gate 30, and to output point 15 of inverter 10 by means of transmission gate 40. Transmission gates 30 and 40 have similar configurations. Each of the gates 30 and 40 consists of an N-type transistor (34 and 44, respectively) and a P-type transistor (32 and 42, respectively) with their conduction paths, as defined by a source and drain electrode, connected in parallel. As explained above, since the devices are bidirectional, their source and drain electrodes are interchangeable as indicated by the two arrows. The connections to the two transmission gates are, however, not identical. First, the transmission gates are connected so that when one is enabled (on) the other one is disabled (off). This is achieved by connecting the gate of P-type transistor 32 in common with the gate of N-type transistor 44 to the signal line marked CP and, the gate of P-type transistor 42 in common with the gate of N-type transistor 34 to the signal line marked $\overline{CP}$. Secondly, the conduction path of transmission gate 40 is connected between input node 28 and output point 15 and the conduction path of transmission gate 30 is connected between input node 28 and input node 18.

Figure 2:
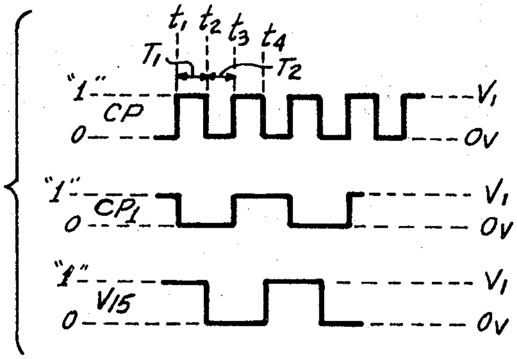
FIG. 2 is a waveform diagram illustrating the input and output signals for the circuit of FIG. 1.

The operation of the circuit of FIG. 1 is best understood by referring to Table I and to the waveshapes shown in FIG. 2.

TABLE I

| Time | CP | $\overline{CP}$ | T.G.[1] 40 | T.G.[1] 30 | $V_{18}$ | $V_{15}$ | $\overline{CP}_1$, $V_{28}$ | $CP_1$, $V_{25}$ |
|---|---|---|---|---|---|---|---|---|
| $t_1$ | 1 | 0 | On | Off | 0 | 1 | 1 | 0 |
| $t_2$ | 0 | 1 | Off | On | $\frac{C_A}{C_A+C_B}[V_{28}]_{t_1}\cong 1$ | 0 | $\frac{C_A}{C_A+C_B}[V_{28}]_{t_1}\cong 1$ | 0 |
| $t_3$ | 1 | 0 | On | Off | $\frac{C_A}{C_A+C_B}[V_{28}]_{t_1}\cong 1$ | 0 | 0 | 1 |
| $t_4$ | 0 | 1 | Off | On | $\frac{C_A}{C_A+C_B}[V_{18}]_{t_3}\cong 0$ | 1 | $\frac{C_A}{C_A+C_B}[V_{18}]_{t_3}\cong 0$ | 1 |
| $t_5$ | 1 | 0 | On | Off | $\cong 0$ | 1 | 1 | 0 |

[1] T.G. Transmission gate.

Also, it is convenient to discuss the operation of the circuit of FIG. 1 and of the other circuit in Boolean terms. The convention arbitrarily adopted is that $V_1$ volts represents the binary digit (bit) 1 and ground represents the bit 0. To further simplify the explanation of the circuit operation, in the discussion which follows it is sometimes stated that a 1 or a 0 is applied to a circuit or obtained from a circuit rather than stating that a voltage which is indicative of a 1 or 0 is applied to or derived from a circuit.

Each cycle (one period) of the clock pulse (CP) consists of two time intervals denoted in FIG. 2 as $T_1$ and $T_2$. The clock signal amplitude is two-valued, being maintained at one level $V_1$ volts (logic 1) for time interval $T_1$ and at 0 volts (logic 0) for a time interval $T_2$.

Starting at time $t_1$ and with interval $T_1$, the CP is equal to 1 and $\overline{CP}$ (which is the inverse of CP) is equal to 0. Under these conditions transmission gate 40 is highly conductive and presents a very low impedance between output point 15 and input node 28 since a positive signal is applied to the gate of N-type transistor 44 and a negative signal is applied to the gate of P-type transistor 42. Transmission gate 30, on the other hand, is cut off since transistors 32 and 34 are reverse-biased.

Assume that initially the voltage at input node 18 ($V_{18}$) is zero and that, therefore, N-type transistor 12 is cut off and P-type transistor 14 is on. A relatively large current can now flow from source 50 through the source and drain path of transistor 14, the conduction path of transmission gate 40 and into capacitive node 28 charging $C_A$ towards a potential equal to $V_1$. Note that the initial current flowing through this path is limited simply by the impedance of transistor 14 and by the impedance of transmission gate 40. When the voltage at input node 28 ($V_{28}$) equals the threshold voltage ($V_T$) of transistor 22, transistor 22 starts conducting, bringing output point 25 towards ground potential. Simultaneously, as the gate voltage continues to increase, transistor 24 is biased into cutoff. The resultant states of the flip-flop at $t_1$ are summarized in line 1 of Table 1 as follows: $V_{28}=V_{15}=\overline{CP}_1 V_1$ volts = logic 1 and $CP_1=V_{18}=0$ volts = logic 0.

At time $t_2$, with the inception of interval $T_2$, CP=0, $\overline{CP}$=1, transistors 34 and 32 are forward-biased turning transmission gate 30 "on" and a low impedance, high conduction path exists between input node 28 and input node 18. Concurrently, transmission gate 40 is cut off since transmission transistors 44 and 42 are reverse-biased.

$C_A$ and $C_B$ are essentially connected in parallel by means of transmission gate 30 and the charge on $C_A$ redistributes itself between $C_A$ and $C_B$. $V_{18}$ will be approximately equal to the ratio of $C_A$ to the sum of $C_A$ and $C_B$ multiplied by the value of voltage present at input node 28 ($V_{28}$) at time $t_1$.

$$V_{18}=\frac{C_A}{C_A+C_B}\times[V_{28}]_{t_1}$$

For proper operation of the circuit it is obvious that $V_{18}$ must be greater than the threshold voltage ($V_T$) of transistor 12. If, $C_A$ is equal to $C_B$, $V_{18}$ is equal to one-half $V_{28}$. If $C_A$ is equal to $2\times C_B$, $V_{18}$ will be equal to $2/3 V_{28}$. Note that this is one instance when the loading of additional stages (not shown) on the $\overline{CP}_1$ line enhances the operation of the circuit since these additional loads, being capacitive and in parallel with $C_A$, make $C_A$ larger. Given the proper ratio of capacitance, the transferral of charge from $C_A$ to $C_B$ renders the voltage at input node 18 sufficiently positive to turn transistor 12 on and to cut off transistor 14. Since transistor 14 is off, output point 15 is disconnected from the positive terminal of source 50. Transistor 12 being turned on brings output point 15 towards ground potential (logic 0). Since transmission gate 40 is open the voltage at input node 28 does not sense this change of state and the two output lines $CP_1$ and $\overline{CP}_1$ do not change state until the next positive excursion of the clock signal (CP). The significant circuit states at time $t_2$ are thus $V_{18}=\overline{CP}_1=1$, and $V_{15}=CP=0$ as shown in line 2 of Table I. When the CP goes positive at $t_3$, transmission gates 30 and 40 are again turned off and now respectively, as described above. However, output point 15 is now clamped to ground and $C_A$ is, therefore, discharged to ground potential by the path comprising transmission gate 40, and the low drain-source impedance of transistor 12. Simultaneously, transistor 24 is turned on and transistor 22 is reverse biased. The states of the flip-flop are thus $CP_1=V_{18}=1$, and $\overline{CP}_1=V_{15}=0$, as shown in line 3 of Table I. At time $t_4$, transmission gate 30 is turned on and transmission gate 40 is turned off as explained above. $C_A$ and $C_B$ are again essentially connected in parallel and since $C_A$ is now completely discharged, it is the charge on $C_B$ which is now redistributed between $C_A$ and $C_B$. Where, for example, $C_A$ is at least twice as large as $C_B$, the voltage across the parallel combination decreases so that the voltage is at most one-third (1/3) the value across $C_B$ just prior to time $t_4$. The voltage at input node 18 is thus decreased below the threshold voltage of transistor 12. Transistor 12 turns off, but transistor 14 turns on, driving output point 15 towards $V_1$. The states of the flip-flop are thus $\overline{CP}_1=V_{18}=0$, and $CP_1$32 $V_{15}=1$. It, therefore, takes two cycles of the input clock pulse to get one cycle of the $CP_1$ output.

The circuit of FIG. 1 has been operated with a source 50 of 3 volts potential and with a clock signal of 3 volts amplitude over a range of frequencies varying from 1 kHz. to 1 MHz. Increasing the clock signal amplitude and the power supply potential to 10 volts extended the operating range to 10 MHz.

The output signals $CP_1$ and $\overline{CP}_1$ change state every time the input clock signal CP goes positive, while the signal present at output point 15 and at input node 18 changes state every time the clock signal goes negative. The signals present at inverter 10 have the same frequency as the signals present at inverter 20, but are displaced with respect to each other by a phase shift of 90°.

It should be obvious from the discussion of the operation that the behavior of the transmission gate is analogous to a single pole, double throw switch which is activated at a certain frequency $f_1$. The ensuing changes at the input points and output points of the two inverters vary at one-half the $f_1$ rate.

The signal source need not be a symmetrical signal. The only requirement on $T_1$ and $T_2$ is that each period be long enough to allow for the charging and discharging of the circuit capacitances shown as $C_A$ and $C_B$.

Figure 3:
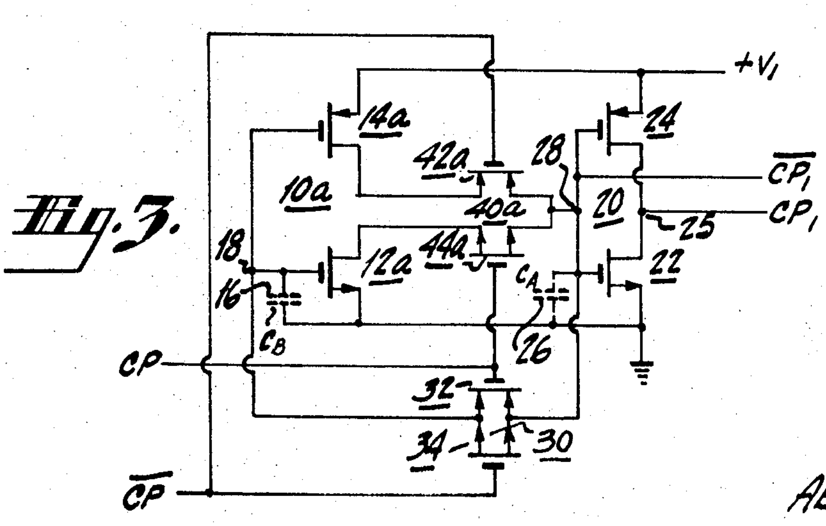
FIG. 3 is a circuit diagram of another embodiment of the invention.

FIG. 3 shows another embodiment of the invention which differs from the circuit of FIG. 1 in the way transmission means 40*a* is connected to inverter means 10*a*. Inverter means 10*a* comprises P-type transistor 14*a* and N-type transistor 12*a*. Transistor 14*a* has its source connected to the positive terminal of source $V_l$ and its drain connected to one of the source and drains of P-type transistor 42*a*, the other one of the source and drains of transistor 42*a* being connected to input node 28. Transistor 12*a* has its source connected to ground potential and its drain connected to one of the source and drains of N-type transistor 44*a*, the other one of the source and drains of transistor 44*a* being connected to input node 28. The circuit of FIG. 3 requires less silicon area than the circuit of FIG. 1, since the metal line connecting the drains of transistor 14 and transistor 12 at output point 15 and the connection between output point 15 and one end of transmission gate 40 has been eliminated. However, the operation of the circuit is essentially the same as the operation of the circuit of FIG. 1.

Examination of the behavior of transmission gate means 40*a* shows that transistor 42*a* clamps the drain of transistor 14*a* to input node 28 when $\overline{CP}$ is negative and that transistor 44*a* clamps input node 28 to the drain of transistor 12*a* when CP is positive. Thus, if $V_{18}$ is low and CP=1 transistor 14*a* will be in conduction, clamping input node 28 to $V_1$ and, if $V_{18}$ is high, input node 28 is clamped to ground potential by the drain-to-source impedance of transistor 12*a*. note that though the conduction paths of transistors 42*a* and 44*a* are not connected in parallel, the clamping transistor always operates in the common source mode eliminating any follower mode type action.

The behavior of inverter means 10*a* is, therefore, substantially equivalent to the behavior of the inverter stage 10 of FIG. 1, and the behavior of transmission gate means 40*a* is substantially equivalent to the behavior of the transmission gate 40 of FIG. 1.

In summary, there has been described a dynamic flip-flop which comprises two inverter means and two switching means. Each inverter means may include either a transistor and a resistor, or two transistors wherein one of the two transistors is used either as a load or as an active device. The switching means necessary to practice the invention conceptually could be a simple single pole, double throw switch. The switching means have been illustrated by two-transistor transmission gate means. It should be obvious that a multiplicity of vibrating devices may be used to implement this function.

I claim:

1. The combination comprising first and second means, each having an input node and an output means;
   - first switching means connected between the input node of the first inverter means and the input node of the second inverter means; and
   - second switching means connected between the output means of the first inverter and the input node of the second inverter.

2. In the combination set forth in claim 1, each inverter means including at its input mode a charge storage means.

3. The combination as claimed in claim 2, wherein said first and second switching means are alternately enabled.

4. The combination as claimed in claim 2, further including first and second terminal points;
   - means connecting the first and second inverter means in parallel between said terminal points;
   - wherein each switching means comprises a pair of transistors, one transistor being of one conductivity type and the other of opposite conductivity type; and
   - means for connecting a source of potential between said terminal points.

5. The combination as claimed in claim 4, wherein each transistor has first and second electrodes defining the ends of a conduction path and a control electrode;
   - wherein each inverter comprises a pair of transistors of different conductivity type;
   - wherein the two transistors of the first inverter means have their control electrodes connected to said first input node;
   - wherein the two transistors of the second inverter means have their control electrodes connected to said second input node and one end of their conduction paths connected in common at said second output means; and
   - wherein the two transistors of the first switching means have their conduction paths connected in parallel.

6. The combination as claimed in claim 5;
   - wherein the two transistors of the first inverter means have one end of their conduction paths connected in common at said first output means; and
   - wherein the two transistors of the second switching means have their conduction paths connected in parallel between said input node of the second inverter means and the output means of the first inverter means.

7. The combination as claimed in claim 5;
   - wherein one of the two transistors of the second switching means has one end of its conduction path connected to one end of the conduction path of one of the two transistors of the first inverter means and the other transistor of the second switching means has one end of its conduction path connected to one end of the conduction path of the other transistor of the first inverter means, and the other ends of the conduction paths of the switching means transistors being connected in common to the input node of the second inverter means; and wherein the other end of the conduction path of one transistor of the first inverter means is connected to the first terminal point, and the other end of the conduction path of the other transistor of the first inverter means is connected to the second terminal point.

8. The combination as claimed in claim 4, wherein the transistors are insulated-gate field-effect transistors.

9. The combination as claimed in claim 4, further including means for applying an alternating signal and its complement to said switching means; and wherein said alternating signal is applied to the control electrodes of the one conductivity-type transistor of the first switching means and to the opposite conductivity-type transistor of the second switching means and the complement of said alternating signal is applied to the control electrodes of the opposite conductivity-type transistor of the first switching means and to the one conductivity-type transistor of the second switching means.

10. The combination as claimed in claim 1 further including clock signal means coupled to said first and second switching means for enabling said first switching means and disabling said second switching means during a first time interval, and for disabling said first switching means and enabling said second switching means during a second time interval; each first time interval being succeeded by said second time interval and each second time interval being succeeded by said first time interval.

11. A counter stage comprising:

first and second inverter means each having an input mode and an output means;

first switching means for connecting the output means of the first inverter means to the input node of the second inverter means only during a first time interval for transferring the signal at said output means of said first inverter means to the input node of said second inverter means; and second switching means for connecting the input node of the second inverter means to the input node of the first inverter means only during a second time interval succeeding said first time interval for transferring a portion of the signal derived from the output means of said first inverter means and now present at the input node of said second inverter means to the input node of said first inverter means.

12. In combination:

first and second logical inverter means, each having an input terminal and an output terminal;

first and second charge storage means, the first connected between the input terminal of said first inverter means and a source of reference potential and the second connected between the input terminal of the second inverter means and said source of reference potential;

means connecting the output terminal of the first inverter means to the input terminal of the second inverter means during one time interval; and means for opening the connection between said output and input terminal and concurrently connecting the input terminal of said second inverter means to the input terminal of said first inverter means, during a second time interval.

13. In the combination as set forth in claim 12, each charge storage means comprising a distributed capacitance.

14. In the combination as set forth in claim 13, each inverter means comprising a pair of complementary symmetry field-effect transistors, the conduction paths of which are connected in series, the input terminal of which comprises a common connection to the gate electrodes of said pair of transistors, and the output terminal of which comprises the connection between the conduction paths of said pair of transistors.